(12) United States Patent
You et al.

(10) Patent No.: US 11,869,952 B2
(45) Date of Patent: Jan. 9, 2024

(54) SEMICONDUCTOR STRUCTURE AND METHOD FOR FORMING SAME

(71) Applicant: CHANGXIN MEMORY TECHNOLOGIES, INC., Hefei (CN)

(72) Inventors: Kang You, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 205 days.

(21) Appl. No.: 17/386,474

(22) Filed: Jul. 27, 2021

(65) Prior Publication Data

US 2021/0359094 A1    Nov. 18, 2021

Related U.S. Application Data

(63) Continuation of application No. PCT/CN2021/079667, filed on Mar. 9, 2021.

(30) Foreign Application Priority Data

Mar. 27, 2020 (CN) .......................... 202010230470.2

(51) Int. Cl.
*H01L 29/423* (2006.01)
*H01L 21/02* (2006.01)
(Continued)

(52) U.S. Cl.
CPC .... *H01L 29/4236* (2013.01); *H01L 21/02057* (2013.01); *H01L 29/0847* (2013.01); *H01L 29/401* (2013.01); *H01L 29/66621* (2013.01)

(58) Field of Classification Search
CPC ......... H01L 29/08; H01L 29/40; H01L 29/66; H01L 29/78; H01L 29/423; H01L 29/4236; H01L 29/401; H01L 29/0847; H01L 29/66477; H01L 29/66621; H01L 29/66628; H01L 21/02; H01L 21/28; H01L 21/762; H01L 21/02057; H01L 21/28008;
(Continued)

(56) References Cited

U.S. PATENT DOCUMENTS

| 5,089,872 A | * | 2/1992 | Ozturk | .............. | H01L 21/28525 |
| | | | | | 257/E21.166 |
| 6,252,277 B1 | * | 6/2001 | Chan | ................. | H01L 29/66621 |
| | | | | | 257/E29.267 |

(Continued)

FOREIGN PATENT DOCUMENTS

CN    103094121 A    5/2013

OTHER PUBLICATIONS

International Search Report in the international application No. PCT/CN2021/079667, dated Jun. 1, 2021, 2 pgs.

(Continued)

*Primary Examiner* — Chuong A Luu
(74) *Attorney, Agent, or Firm* — Cooper Legal Group, LLC (57) ABSTRACT

A semiconductor structure and a method for forming the same are provided. The method includes: forming an active region on a substrate; forming at least one trench in the active region, the trench at least dividing the active region into a source region on one side of the trench and a drain region on the other side of the trench; and forming an elevated source region and an elevated drain region on the source region and the drain region respectively.

13 Claims, 10 Drawing Sheets

(51) Int. Cl.
*H01L 29/08* (2006.01)
*H01L 29/40* (2006.01)
*H01L 29/66* (2006.01)

(58) Field of Classification Search
CPC ......... H01L 21/28088; H01L 21/28114; H01L 21/76224; H01L 29/7813; H01L 29/7825; H01L 29/0843; H01L 29/0891; H01L 29/42352; H01L 29/42336; H01L 29/66613; H01L 29/66636; H01L 29/417; H01L 29/66643; H01L 29/41783; H01L 21/8234; H01L 21/8238; H01L 21/823418; H01L 21/823425
USPC ........................................................ 257/327
See application file for complete search history.

(56) References Cited

U.S. PATENT DOCUMENTS

| | | | |
|---|---|---|---|
| 8,313,995 B2 | 11/2012 | Poelzl | |
| 9,806,187 B2 | 10/2017 | Poelzl | |
| 2007/0284647 A1* | 12/2007 | Seo | H10B 12/09 |
| | | | 257/E29.267 |
| 2012/0184095 A1* | 7/2012 | Poelzl | H01L 29/7397 |
| | | | 438/589 |
| 2013/0040443 A1 | 2/2013 | Poelzl | |
| 2014/0117368 A1 | 5/2014 | Haensch et al. | |

OTHER PUBLICATIONS

IMEC Offerings (Ascent+Showroom), Dec. 2021, Ascent+ European Nanoelectronics Access, reprinted from the Internet at: http://www.ascent.network/access/facilities/imec-offer/, 4 pgs.
"How FinFET Device Performance Is Affected by Epitaxial Process Variations", Sep. 2019, Semiconductor Engineering, Reprinted from the Internet at: https://semiengineering.com/how-finfet-device-performance-is-affected-by-epitaxial-process-variations/, 11 pgs.
First Office Action of the Chinese application No. 202010230470.2, dated May 18, 2022, 19 pages.
English translation of the Written Opinion of the International Search Authority in the international application No. PCT/CN2021/079667, dated Jun. 1, 2021, 4 pages.
Imec Offerings (Ascent+Showroom), 2020, Reprinted from the Internet at: http://www.ascent.network/access/facilities/imec-offer/, 4 pgs.
"How FinFET Device Performance Is Affected by Epitaxial Process Variations", Sep. 2019, Jacky Huang, Semiconductor Engineering, Reprinted from the Internet at: https://semiengineering.com/how-finfet-device-performance-is-affected-by-epitaxial-process-variations/, 11 pgs.

* cited by examiner

SEMICONDUCTOR STRUCTURE AND METHOD FOR FORMING SAME

CROSS-REFERENCE TO RELATED APPLICATION

This application is a continuation application of International Application No.: PCT/CN2021/079667, filed on Mar. 9, 2021, which claims priority to Chinese patent application No. 202010230470.2, filed on Mar. 27, 2020, and entitled "Semiconductor Structure and METHOD FOR FORMING SAME". International Application No.: PCT/CN2021/079667 and Chinese patent application No. 202010230470.2 are hereby incorporated by reference in their entireties.

BACKGROUND

As the size of a transistor is getting reduced continuously, a gate structure is smaller and smaller due to the limitation of the length of an active region, therefore it is more difficult to manufacture a transistor. For example, a trench with a buried gate is narrower and narrower, and a depth-to-width ratio of the trench is larger and larger, so that the material filling when a gate structure is formed is limited. Moreover, the size of the gate structure is reduced, so that the resistance of the gate structure is increased, and the electrical performance is reduced.

SUMMARY

The disclosure relates to the technical field of semiconductors, and in particular to a semiconductor structure and a method for forming the semiconductor structure.

The technical problem to be solved by the disclosure is how to reduce the manufacturing difficulty of a gate structure under the condition that an active region has a certain size, and to improve the electrical performance of the formed gate structure.

To this end, the disclosure provides a method for forming a semiconductor structure, which includes the following steps.

A substrate is provided.

An active region is formed on the substrate;

At least one trench is formed in the active region, which at least divides the active region into a source region on one side of the trench and a drain region on the other side of the trench.

An elevated source region and an elevated drain region is formed on the source region and the drain region, respectively.

In one of the embodiments, the elevated source region and the elevated drain region is formed by a selective epitaxial process.

In one of the embodiments, before the elevated source region and the elevated drain region are formed by adopting a selective epitaxial process, the method further includes:

a surface of the source region and a surface of the drain region is cleaned by an in-situ cleaning process.

In one of the embodiments, the method further includes a step that a gate structure is formed in the trench, in which an upper surface of the gate structure is flush with an upper surface of the active region.

In one of the embodiments, the method further includes steps that: a gate structure is formed in the trench, and a barrier layer is formed on the gate structure.

In one of the embodiments, the process of forming the elevated source region and the elevated drain region includes the following steps.

A covering layer is formed on the active region.

An elevated source region opening and an elevated drain region opening is formed in the covering layer, and the active region is exposed by the elevated source region opening and the elevated drain region opening.

The elevated source region and the elevated drain region are formed in the elevated source region opening and the elevated drain region opening, respectively.

The disclosure also provides a semiconductor structure, which includes: a substrate, at least one trench, an elevated source region and an elevated drain region.

The substrate is provided with an active region.

The at least one trench is located in the active region, which at least divides the active region into a source region on one side of the trench and a drain region on another side of the trench.

The elevated source region is located on the source region.

The elevated drain region is located on the drain region.

In one of the embodiments, a top width of the elevated source region is greater than a bottom width of the elevated source region, and a top width of the elevated drain region is greater than a bottom width of the elevated drain region.

In one of the embodiments, an opening size of the trench is greater than a bottom width of the elevated source region or a bottom width of the elevated drain region.

In one of the embodiments, a bottom width of the elevated source region is equal to a top width of the source region, and a bottom width of the elevated drain region is equal to a top width of the drain region.

In one of the embodiments, two trenches are located in a same active region, a size of the active region is in a range of 20-145 nm, a width of the trench is in a range of 5-25 nm, and a depth of the trench is in a range of 10-30 nm.

In one of the embodiments, a depth-to-width ratio of the trench is less than 3:1.

In one of the embodiments, a thickness of the elevated source region or the elevated drain region is in a range of 5-100 nm.

In one of the embodiments, the semiconductor structure further includes: a gate structure, located in the trench, in which an upper surface of the gate structure is flush with an upper surface of the active region.

In one of the embodiments, the semiconductor structure further includes: a gate structure, located in the trench; and a barrier layer, located on the gate structure, in which an upper surface of the barrier layer is flush with an upper surface of the active region.

In one of the embodiments, a thickness of the barrier layer is in a range of 1-10 nm, or the thickness of the barrier layer is $1/10$-$1/5$ of the depth of the trench.

Compared with the prior art, the technical solution the disclosure has the following advantages.

According to some embodiments, a method for forming a semiconductor structure of the disclosure, an active region is formed on a substrate; at least one trench is formed in the active region, and the trench at least divides the active region into a source region on one side of the trench and a drain region on the other side of the trench; and an elevated source region and an elevated drain region are formed on the source region and the drain region respectively. In the disclosure, electric connection points of the source region and the drain region are led out by forming the elevated source region and the elevated drain region on the source region and the drain region respectively. Therefore, when the trench is formed with the active region having a certain size, the width of the trench can be increased while the depth and the depth-to-width ratio can be decreased, so that the manufacturing difficulty for forming a gate structure in the trench is reduced, and the electrical performance of the formed gate structure is improved.

Further, the bottom width of the elevated source region is equal to the top width of the source region, the bottom width of the elevated drain region is equal to the top width of the drain region, the top width of the elevated source region is greater than the bottom width of the elevated source region, and the top width of the elevated drain region is greater than the bottom width of the elevated drain region. Therefore, when the size of the trench formed in the active region is increased and the sizes of the source region and the drain region formed in the active region correspondingly are reduced with the active region having a certain size, the electrical connection performance when the sizes of the source region and the drain region are reduced can still be ensured by the elevated source region and the elevated drain region due to the increased top sizes of the elevated source region and the elevated drain region, a gate material can be easily filled when the gate structure is formed in the trench, the resistance of the formed gate structure is reduced, the manufacturing difficulty of the gate structure is reduced, and the electrical performance of the gate structure is improved.

Further, the elevated source region and the elevated drain region are formed by the selective epitaxial process, so that the top width of the formed elevated source region is greater than the bottom width of the elevated source region, the top width of the formed elevated drain region is greater than the bottom width of the elevated drain region, and the position accuracy and the size accuracy of the formed elevated source region and elevated drain region are improved.

Further, the barrier layer is formed on the gate structure, and the barrier layer can protect the gate structure from being damaged in subsequent processes.

The semiconductor structure of the disclosure includes a substrate and at least one trench. The substrate is provided with an active region. The trench is located in the active region and at least divides the active region into a source region on one side of the trench and a drain region on the other side of the trench. An elevated source region and an elevated drain region are provided on the source region and the drain region, respectively. In the case that the active region has a certain size, the manufacturing difficulty of the gate structure can be reduced, so that the formed gate structure does not have filling defects, the resistance of the formed gate structure is small, and the electrical connection performance of the source region and the drain region is not influenced.

DETAILED DESCRIPTION

The disclosure provides a semiconductor structure and a method for forming semiconductor structure. The method for forming semiconductor structure includes the following operations. An active region is formed on a substrate. At least one trench is formed in the active region. The trench at least divides the active region into a source region on one side of the trench and a drain region on the other side of the trench. An elevated source region and an elevated drain region are formed on the source region and the drain region, respectively. In the disclosure, by forming the elevated source region and the elevated drain region on the source region and the drain region respectively, a depth-to-width ratio of the formed trench can be reduced, thereby reducing the manufacturing difficulty of the semiconductor structure.

In order that the above objects, features, and advantages of the disclosure may be more readily understood, specific implementations of the disclosure will now be described in detail with reference to the accompanying drawings. In the detailed description of the examples of the disclosure, for convenience of description, the schematic diagram will be partially enlarged not according to an ordinary ratio, and the schematic diagram is only an example, which should not limit the protection scope of the disclosure. In addition, three-dimensional space dimensions of length, width, and depth should be included in actual production.

FIGS. 1-10 are schematic structure diagrams of a semiconductor structure forming process according to examples of the disclosure.

Figure 1:
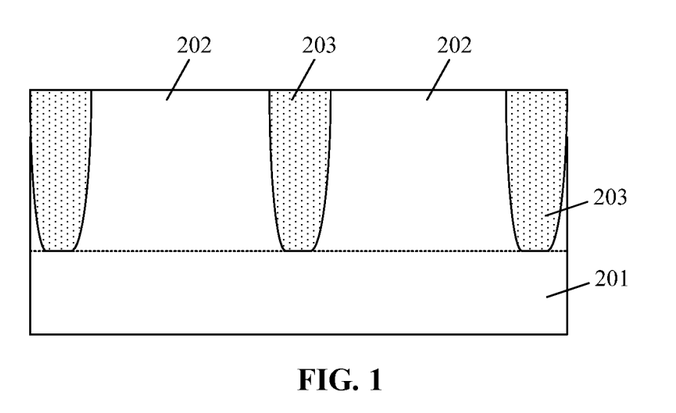
FIGS. 1-10 are schematic structure diagrams of process for forming a semiconductor structure according to examples of the disclosure.

Referring to FIG. 1, a substrate 201 is provided. An active region 202 is formed on the substrate 201.

The substrate 201 may be made of silicon (Si), germanium (Ge), silicon germanium (GeSi), silicon carbide (SiC), silicon-on-insulator (SOI), germanium-on-insulator (GOI), or other materials, e.g. III-V compounds such as gallium arsenide. The substrate 201 is made of silicon in the present example. Certain impurity ions are doped in the substrate as required. The impurity ions may be N-type impurity ions or P-type impurity ions. In an example, the doping includes trap region doping and/or source/drain region doping.

There are several (i.e., two or more). active regions 202. Any adjacent active regions 202 are isolated by an isolation layer 203.

In an example, the forming process of the active regions 202 is as follows. A first mask layer (not shown in the figure) is formed on the substrate 201. The first mask layer is provided with a plurality of first mask openings. The first mask openings divide the first mask layer into a plurality of strip-shaped masks. A second mask layer is formed on the strip-shaped masks and in the first mask openings. A second mask openings are formed in the second mask layer on the strip-shaped masks. The strip-shaped masks are respectively divided into a plurality of discrete active region masks by utilizing the second mask openings. The substrate 201 is etched by utilizing the active region masks to form the active regions 202. It is to be noted that the active regions 202 and the semiconductor substrate 201 is separated by a dashed line in order to facilitate distinguishing between the active regions 202 and the semiconductor substrate 201.

In other examples, the active regions 202 may be formed by an epitaxial process.

Figure 2:
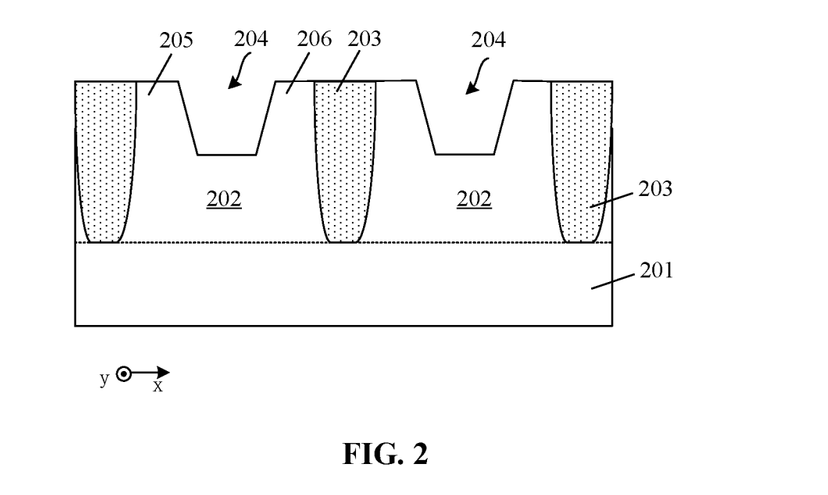

Referring to FIG. 2, at least one trench 204 is formed in each of the active regions 202, and the trench 204 at least divides a active region into a source region 205 on one side of the trench 204 and a drain region 206 on the other side of the trench 204.

At least one trench is formed in each of the active region 202 by etching the active region 202, and a gate structure is subsequently formed in the trench 204. In an example, a first isolation layer between two active regions 202 is etched while the active regions 202 are etched, and the trench is formed in the active regions 202 and the first isolation layer.

In the present example, referring to FIG. 2, there is one trench 204 in each active region 202. The trench 204 divides the active region into a source region 205 on one side of the trench 204 and a drain region 206 on the other side of the trench 204. An opening size (width or diameter) of the trench 204 is greater than a bottom width of an elevated source region subsequently formed on the source region 205 or a bottom width of an elevated drain region subsequently formed on the drain region 206. In this application, since the elevated source region and the elevated drain region are subsequently formed on the source region and the drain region to lead out connection points, when the trench 204 is formed under the condition that the active region 202 has a certain size, the width of the formed trench 204 can be increased, the depth can be decreased, and the widths of the source region 205 and the drain region 206 can be correspondingly reduced, so that the filling of materials is facilitated when the gate structure is subsequently formed, and the resistance of the subsequently formed gate structure can be reduced.

In an example, the width of the trench 204 is in the range of 1-50 nm. Specifically, the width may be 5 nm, 10 nm, 15 nm, 20 nm, 25 nm, 30 nm, 35 nm, 40 nm or 45 nm. The depth of the trench 204 is in the range of 1-80 nm. Specifically, the depth may be 10 nm, 20 nm, 30 nm, 40 nm, 50 nm, 60 nm or 70 nm.

In a specific example, the size of the active region 202 is in the range of 10-70 nm, the width of the trench 204 is in the range of 5-25 nm, and the depth of the trench 204 is in the range of 10-30 nm, so that the width of the trench can be as large as possible, the depth-to-width ratio can be as small as possible, the difficulty in subsequent gate material filling can be further reduced, and the resistance of the gate structure can be further reduced. Specifically, when the width of the trench 204 is in the range of 5-25 nm, the depth-to-width ratio of the trench 204 is less than 3:1, e.g., 2.5:1, 2:1, or 1.5:1.

It is to be noted that in the foregoing and subsequent examples, the size of the active region 202, the width of the trench 204, the width of the source region 205, and the width of the drain region 206 all refer to the maximum sizes of the active region 202, the trench 204, the source region 205, and the drain region 206 in an x-axis direction (as shown in FIG. 2). Specifically, the x-axis direction may be an extending direction of the active region 202.

Figure 3:
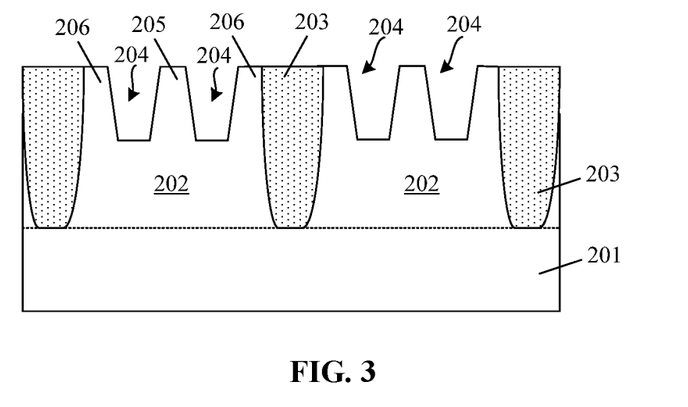

In other examples, referring to FIG. 3, there are two trenches 204 formed in each active region 202. The two trenches 204 divide the active region 202 into a source region 205 located between the two trenches 204 and two drain regions 206 located at the outer sides of the two trenches 204, respectively. gate structures may be subsequently respectively formed in the two trenches 204 in each active region 202. In other examples, the middle portion of the active region between the two trenches 204 is a drain region, and the two end portions of the active region at both outer sides of the two trenches are source regions.

In a specific example, referring to FIG. 3, the size of the active region 202 is in the range of 20-145 nm, the width of the trench 204 is in the range of 5-25 nm, and the depth of the trench 204 is in the range of 10-30 nm. By making the width of the trench as large as possible and the depth-to-width ratio as small as possible, the difficulty in subsequent gate material filling can be further reduced, and the resistance of the gate structure can be further reduced. Meanwhile, with the elevated source region and the elevated drain region which are subsequently formed on the source region and the drain region, the electrical connection performance of the source region and the drain region is not influenced as much as possible. Specifically, when the width of the trench 204 is in the range of 5-20 nm, the depth-to-width ratio of the trench 204 is less than 3:1, e.g., 2.5:1, 2:1, or 1.5:1.

Figure 4:
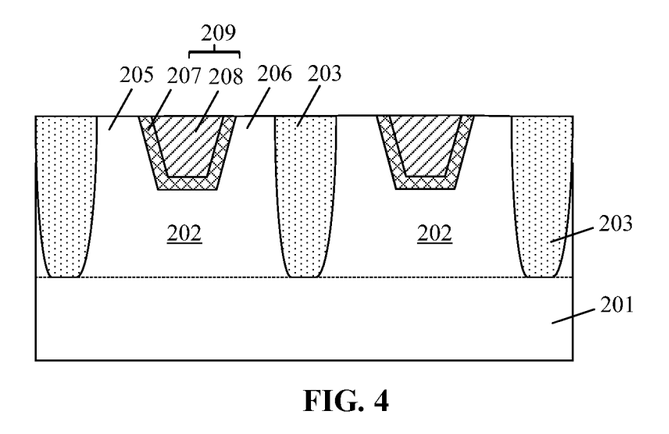
Figure 5:
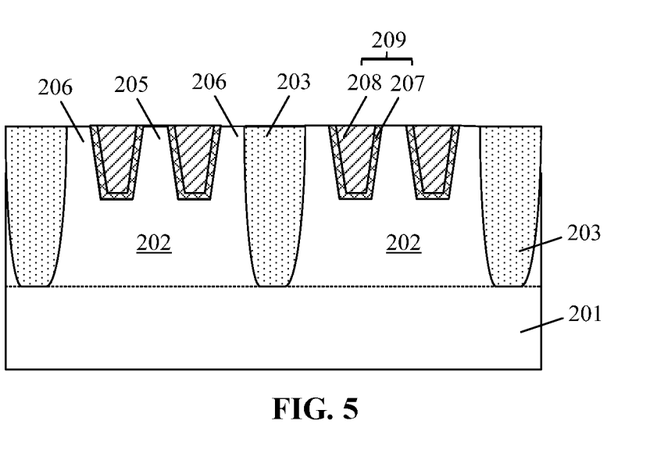

Referring to FIG. 4, FIG. 4 is on the basis of FIG. 2, and a gate structure 209 is formed in the trench.

In the present example, referring to FIG. 4, the active region 202 is provided with one trench, and a gate structure 209 is formed in the trench. In other examples, referring to FIG. 5 which is on the basis of FIG. 3, when there are two trenches in each active region 202, a gate structure 209 is formed in each of the two trenches.

In an example, the gate structure 209 includes a gate dielectric layer 207 located on a side wall and a bottom surface of the trench, and a conductive electrode 208 located on the gate dielectric layer 207 which fills up the trench. In other examples, the gate structure 209 may include a gate dielectric layer located on the bottom of the trench and on a surface of the side wall of the trench, a transition layer located on the gate dielectric layer, and a conductive electrode located on the transition layer which fills up the trench.

In an example, the gate dielectric layer may be made of silicon oxide, the transition layer may be made of TiN, and the conductive electrode 208 may be made of W or other suitable metallic materials. The conductive electrode 208 may also be a composite electrode, such as a double-layer electrode with a lower portion of W or other metal and an upper portion of polysilicon. The composite electrode can improve the device performance of a transistor.

In an example, the forming process of the gate structure 209 includes the following operations. A silicon oxide layer is formed on the side wall and bottom surface of a word line trench. The silicon oxide layer may be formed by a thermal oxidation process specifically. A transition layer is formed on the silicon oxide layer. A metal layer is formed on the transition layer. The metal layer and the transition layer, higher than the surface of the active region 202, are removed by a planarization or back-etching process. Thus, the gate structure 209 is formed. The upper surface of the gate structure 209 is flush with the upper surface of the active region 202. Specifically, in a practical process, it is difficult to control a manufacturing method to make the upper surface of the gate structure 209 absolutely flush with the upper surface of the active region 202 due to a process deviation which always exists. It is only acceptable that the upper surface of the gate structure 209 is substantially flush with the upper surface of the active region 202.

Figure 6:
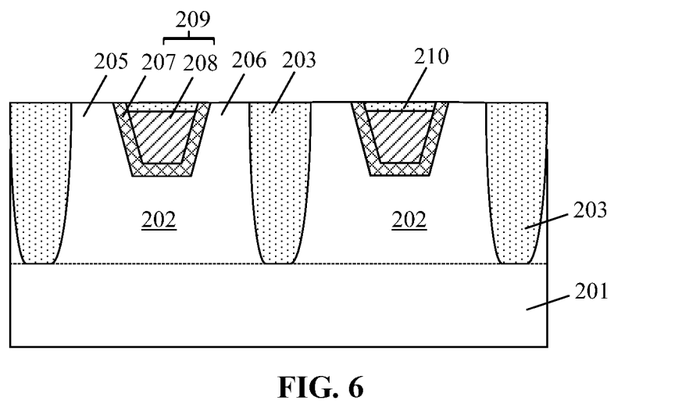
Figure 7:
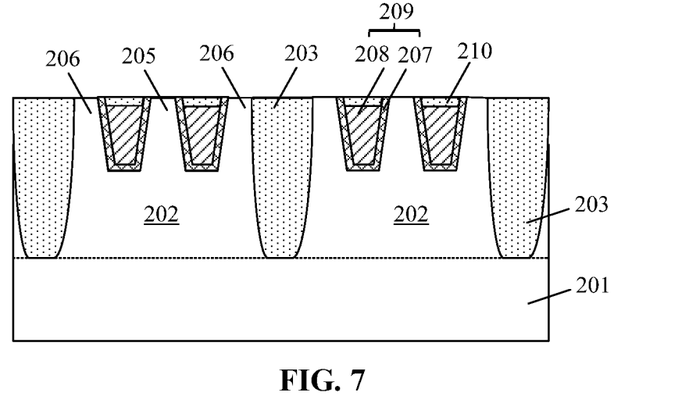

Referring to FIG. 6, FIG. 6 is on the basis of FIG. 4, and a barrier layer 210 is formed on the surface of (or on) the gate structure 209 before the elevated source region and the elevated drain region are formed.

In the present example, referring to FIG. 6, the active region 202 is provided with one trench, and a barrier layer 210 is formed on the surface of a gate structure 209 in the trench. In other examples, referring to FIG. 7, which is on the basis of FIG. 5, when there are two trenches in each active region 202, a barrier layer 210 is formed on the surface of the gate structure in each of the two trenches in the active region 202. The barrier layer 210 protects the gate structure 209 from being damaged by subsequent processes. The material of the barrier layer 210 is different from that of the substrate 201. Specifically, the material of the barrier layer 210 may be one or more of silicon nitride, silicon oxide, or silicon oxynitride. In order to minimize the influence on the size of the gate structure, the barrier layer 210 should be as thin as possible, provided that a protective effect is ensured. For example, the thickness of the barrier layer 210 is in the range of 1-10 nm, or the thickness of the barrier layer 210 is 1/10-1/5 of the depth of the trench.

In an example, the forming process of the barrier layer 210 may include the following operations. Partial thickness of the conductive electrode 208 in the gate structure 209 is removed by back etching. A barrier layer is formed on the surface of the remaining conductive electrode 208 and the surface of the active region 202. The barrier layer may be formed by a chemical vapor deposition. The barrier layer higher than the surface of the active region 202 is removed by a planarization, therefore the barrier layer 210 is formed on the surface of the remaining conductive electrode 208. The planarization may be a chemical mechanical polishing process.

In other examples, when the barrier layer 210 is formed on the surface of the conductive electrode 208, the barrier layer 210 may also remain on the surface of the active region 202 to protect the active region 202.

Figure 8:
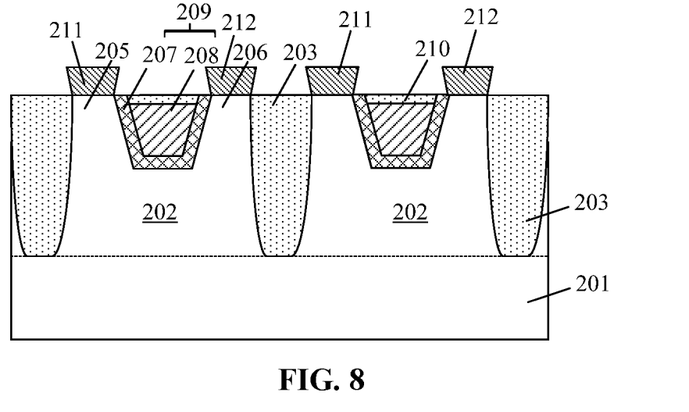

Referring to FIG. 8 which is on the basis of FIG. 6, an elevated source region 211 and an elevated drain region 212 are formed on the source region 205 and the drain region 206, respectively.

The electric connection points of the source region 205 and the drain region 206 are led out through the elevated source region 211 and the elevated drain region 212. The top of the elevated source region 211 and the top of the elevated drain region 212 are electrically connected with connection structures (e.g. conductive plugs), respectively. In the present example, a bottom width of the elevated source region 211 is equal to a top width of the source region 205, a bottom width of the elevated drain region 212 is equal to a top width of the drain region 206, a top width of the elevated source region 211 is greater than the bottom width of the elevated source region 211, and a top width of the elevated drain region 212 is greater than the bottom width of the elevated drain region. Therefore, in the case that the active region 202 has a certain size, when the size of the trench formed in the active region 202 is increased and the sizes of the source region 205 and the drain region 206 formed in the active region correspondingly are reduced, the electrical connection performance can still be ensured through the elevated source region and the elevated drain region due to the increased top sizes of the elevated source region and the elevated drain region even the sizes of the source region 205 and the drain region 206 are reduced, meanwhile a gate material can be easily filled when the gate structure is formed in the trench, and the resistance of the formed gate structure is reduced.

In the present example, referring to FIG. 8, the active region 202 has one trench, one source region 205, and one drain region 206. The elevated source region 211 and the elevated drain region 212 are correspondingly formed on the surfaces of the source region 205 and the drain region 206. In other examples, referring to FIG. 9 which is on the basis of FIG. 7, when there are two trenches in each active region, a source region 205 between the two trenches, and two drain regions 206 at outer sides of the two trenches, an elevated source region 211 and two elevated drain regions 212 are correspondingly formed on the surfaces of the source region 205 and the two drain regions in the active region 202.

In an example, the elevated source region 211 and the elevated drain region 212 are made of the same material as the substrate 201, a bottom width of the elevated source region 211 is equal to a top width of the source region 205, and a bottom width of the elevated drain region 212 is equal to a top width of the drain region 206.

The elevated source region 211 and the elevated drain region 212 may be formed by a selective epitaxial process, so that the top width of the formed elevated source region 211 is greater than the bottom width of the elevated source region 211, the top width of the formed elevated drain region 212 is greater than the bottom width of the elevated drain region, and the position accuracy and the size accuracy of the formed elevated source region 211 and elevated drain region 212 can be easily improved. In a specific example, the material for the substrate, the elevated source region and the elevated drain region is silicon.

In an example, before the elevated source region 211 and the elevated drain region 212 are formed by the selective epitaxial process, the method further includes: cleaning the surfaces of the source region 205 and the drain region 206 by an in-situ cleaning process to remove an oxide layer or pollutants on the surfaces of the source region 205 and the drain region 206 so as to improve the quality of the formed elevated source region 211 and elevated drain region 212.

In an example, the thickness of the formed elevated source region 211 or the elevated drain region 212 is in the range of 5-100 nm.

In the present example, the elevated source region 211 and the elevated drain region 212 are formed on the source region 205 and the drain region 206 respectively by directly adopting a selective epitaxial process.

In other examples, the forming process of the elevated source region 211 and the elevated drain region 212 includes the following operations. A covering layer is formed on the active region 202 first. An elevated source region opening and an elevated drain region opening are formed in the covering layer. The elevated source region opening and the elevated drain region opening expose the active region 202. The elevated source region 211 and the elevated drain region 212 are respectively formed in the elevated source region opening and the elevated drain region opening by an epitaxial process or other deposition processes, so as to improve the formation quality of the elevated source region 211 and the elevated drain region 212.

Figure 10:
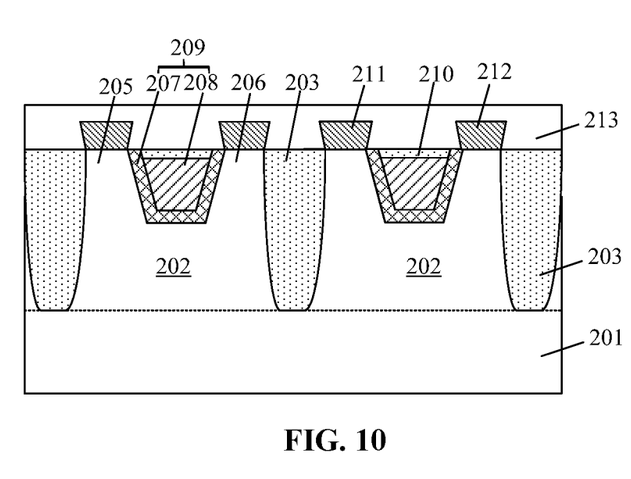

Referring to FIG. 10 which is on the basis of FIG. 8, and a dielectric layer 213 covering the surfaces of the elevated source region 211, the elevated drain region 212, the gate structure 209, and the isolation layer 203 is formed.

The dielectric layer 213 serves to isolate the elevated source region 211 and the elevated drain region 212. The dielectric layer 213 may be made of silicon nitride or silicon oxide.

In an example, the method further includes the following operations. A bit line connected with the elevated source region 211 is formed. A capacitor connected with the elevated drain region 212 is formed. Specifically, the bit line and the capacitor may be connected with the elevated source region 211 and the elevated drain region 212, respectively, by corresponding conductive plugs.

In other examples, when each active region is provided with one source region and two drain regions, one elevated source region and two elevated drain regions are formed correspondingly. The method further includes the following operations. A bit line connected with the elevated source region is formed, and two capacitors respectively connected with the two elevated drain regions are formed.

Figure 9:
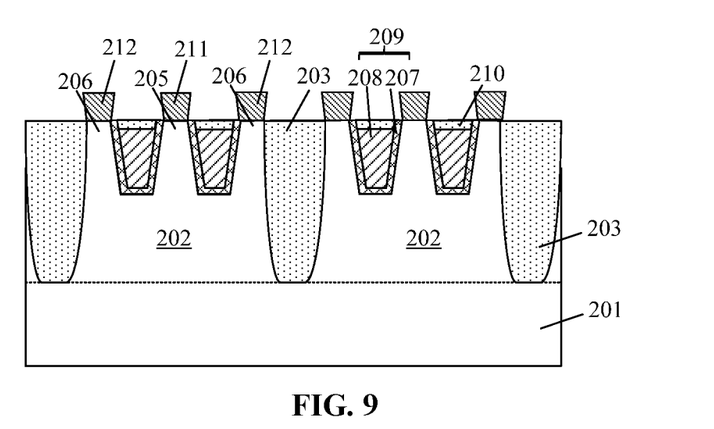

Another example of the disclosure also provides a semiconductor structure. Referring to FIG. 9, the semiconductor structure includes: a substrate 201, at least one trench, an elevated source region 211, and an elevated drain region 212.

The substrate 201 is provided with an active region 202.

The trench is located in the active region 202 and at least divides the active region into a source region 205 on one side of the trench and a drain region 206 on the other side of the trench.

The elevated source region 211 is located on the source region 205.

The elevated drain region 212 is located on the drain region 206.

In an example, a top width of the elevated source region 211 is greater than a bottom width of the elevated source region 211, a top width of the elevated drain region 212 is greater than a bottom width of the elevated drain region 212, a bottom width of the elevated source region 211 is equal to a top width of the source region 205, and a bottom width of the elevated drain region 212 is equal to a top width of the drain region 206.

In an example, the elevated source region 211 and the elevated drain region 212 are formed by a selective epitaxial process. The elevated source region 211 and the elevated drain region 212 are made of the same material as the substrate 201. The thickness of the elevated source region 211 or the elevated drain region 212 is in the range of 5-100 nm.

In the present example, referring to FIG. 9, two trenches are formed in each active region 202. The two trenches divide the active region 202 into a source region 205 located between the two trenches and two drain regions 206 located on both outer sides of the two trenches, respectively. The source region 205 located between the two trenches is provided with an elevated source region 211. Each of the two drain regions 206 are provided with an elevated drain region 212 separately. Specifically, the size of the active region 202 is in the range of 20-145 nm, the width of the trench 204 is in the range of 5-25 nm, and the depth of the trench 204 is in the range of 10-30 nm. When the width of the trench 204 is in the range of 5-20 nm, the depth-to-width ratio of the trench 204 is less than 3:1, e.g., 2.5:1, 2:1, or 1.5:1.

In other examples, referring to FIG. 8, one trench is formed in each active region 202. The trench divides the active region 202 into a source region 205 located on one side of the trench and a drain region 206 located on the other side of the trench. The source region 205 is provided with an elevated source region 211. The drain region 206 is provided with an elevated drain region 212. Specifically, the size of the active region 202 is in the range of 10-70 nm, the width of the trench 204 is in the range of 5-25 nm, and the depth of the trench 204 is in the range of 10-30 nm. When the width of the trench 204 is in the range of 5-25 nm, the depth-to-width ratio of the trench 204 is less than 3:1, e.g., 2.5:1, 2:1, or 1.5:1.

A gate structure 209 located in the trench is further included. An upper surface of the gate structure 209 is flush with an upper surface of the active region 202. Specifically, in a practical process, it is difficult to control a manufacturing method to make the upper surface of the gate structure 209 absolutely flush with the upper surface of the active region 202, since there is always a process deviation. It is fine that the upper surface of the gate structure 209 is substantially flush with the upper surface of the active region 202.

In an example, a barrier layer 210 is further included. The barrier layer 210 is located on the gate structure 209. An upper surface of the barrier layer 210 is flush with an upper surface of the active region 202. In order to minimize the influence on the size of the gate structure, the barrier layer 210 should be as thin as possible while ensuring a protective effect. For example, the thickness of the barrier layer 210 is in the range of 1-10 nm, or the thickness of the barrier layer 210 is $1/10$-$1/5$ of the depth of the trench.

In other examples, the barrier layer 210 may also remain on the surface of the active region 202 to protect the active region 202.

In an example, the semiconductor structure further includes a bit line connected with the elevated source region 211, and a capacitor connected with the elevated drain region 212. Specifically, the bit line and the capacitor may be connected with the elevated source region 211 and the elevated drain region 212, respectively, by corresponding conductive plugs.

In other examples, when each active region is provided with one source region and two drain regions, one elevated source region and two elevated drain regions are formed correspondingly. The semiconductor structure further includes a bit line connected with the elevated source region, and two capacitors respectively connected with the two elevated drain regions.

It is to be noted that other definitions or descriptions of the semiconductor structure in the present example will be omitted, and specific reference should be made to the corresponding definitions or descriptions in the examples of the foregoing semiconductor structure forming process.

Although the disclosure has been disclosed as above in a preferred example, it is not used to limit the disclosure. Any person skilled in the art may make possible variations and modifications on the technical solution of the disclosure by using the above-disclosed method and technical content without departing the spirit and the scope of the disclosure. Therefore, any simple modifications, equivalent variations and modifications made on the above example according to the technical essence of the disclosure without departing the content of the technical solution of the disclosure fall within the protection scope of the technical solution of the disclosure.

The invention claimed is:

1. A method for forming a semiconductor structure, comprising:
   providing a substrate;
   forming an active region on the substrate;
   forming at least one trench in the active region, the at least one trench at least dividing the active region into a source region on one side of the at least one trench and a drain region on another side of the at least one trench;

forming a gate structure in the at least one trench; and forming an elevated source region and an elevated drain region on the source region and the drain region, respectively;

wherein a bottom width of the elevated source region is equal to a top width of the source region, and a bottom width of the elevated drain region is equal to a top width of the drain region;

a top width of the elevated source region is greater than the bottom width of the elevated source region, and a top width of the elevated drain region is greater than the bottom width of the elevated drain region, and an opening size of the at least one trench is greater than the bottom width of the elevated source region or the bottom width of the elevated drain region.

2. The method for forming a semiconductor structure of claim 1, wherein forming the elevated source region and the elevated drain region comprises forming the elevated source region and the elevated drain region by a selective epitaxial process.

3. The method for forming a semiconductor structure of claim 2, wherein before forming the elevated source region and the elevated drain region by the selective epitaxial process, the method further comprises:

cleaning a surface of the source region and a surface of the drain region by an in-situ cleaning process.

4. The method for forming a semiconductor structure of claim 1, wherein further comprising: forming a gate structure in the trench, an upper surface of the gate structure is-being flush with an upper surface of the active region.

5. The method for forming a semiconductor structure of claim 1, further comprising: forming a gate structure in the trench, and forming a barrier layer on the gate structure.

6. The method for forming a semiconductor structure of claim 1, wherein the process of forming the elevated source region and the elevated drain region comprises:

forming a covering layer on the active region;

forming an elevated source region opening and an elevated drain region opening in the covering layer, the active region being exposed by the elevated source region opening and the elevated drain region opening; and forming the elevated source region and the elevated drain region in the elevated source region opening and the elevated drain region opening, respectively.

7. A semiconductor structure, comprising:

a substrate, provided with an active region;

at least one trench located in the active region, the at least one trench at least dividing the active region into a source region on one side of the at least one trench and a drain region on another side of the at least one trench;

a gate structure, located in the at least one trench;

an elevated source region, located on the source region; and an elevated drain region, located on the drain region;

wherein a bottom width of the elevated source region is equal to a top width of the source region, and a bottom width of the elevated drain region is equal to a top width of the drain region;

a top width of the elevated source region is greater than the bottom width of the elevated source region, and a top width of the elevated drain region is greater than the bottom width of the elevated drain region, and an opening size of the at least one trench is greater than the bottom width of the elevated source region or the bottom width of the elevated drain region.

8. The semiconductor structure of claim 7, wherein the at least one trench comprises two trenches located in the same active region, a size of the active region is in a range of 20-145 nm, a width of each of the two trenches is in a range of 5-25 nm, and a depth of each of the two trenches is in a range of 10-30 nm.

9. The semiconductor structure of claim 8, wherein a depth-to-width ratio of each of the two trenches is less than 3:1.

10. The semiconductor structure of claim 7, wherein a thickness of the elevated source region or the elevated drain region is in a range of 5-100 nm.

11. The semiconductor structure of claim 7, wherein an upper surface of the gate structure is flush with an upper surface of the active region.

12. The semiconductor structure of claim 7, further comprising: a barrier layer, located on the gate structure, an upper surface of the barrier layer being flush with an upper surface of the active region.

13. The semiconductor structure of claim 12, wherein a thickness of the barrier layer is in a range of 1-10 nm, or the thickness of the barrier layer is $1/10$-$1/5$ of a depth of the at least one trench.

* * * * *